(12) United States Patent
Bandic et al.

(10) Patent No.: US 10,290,346 B2
(45) Date of Patent: May 14, 2019

(54) METHOD AND APPARATUS FOR LOW-LATENCY READ OF FLASH STORAGE DEVICES USING FRACTIONAL BITS PER CELL

(71) Applicant: Western Digital Technologies, Inc., Irvine, CA (US)

(72) Inventors: Zvonimir Z. Bandic, San Jose, CA (US); Minghai Qin, San Jose, CA (US); Seung-Hwan Song, San Jose, CA (US)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 186 days.

(21) Appl. No.: 15/388,737

(22) Filed: Dec. 22, 2016

(65) Prior Publication Data

US 2018/0181301 A1    Jun. 28, 2018

(51) Int. Cl.
*G11C 11/34* (2006.01)
*G11C 11/56* (2006.01)
*G11C 16/04* (2006.01)

(52) U.S. Cl.
CPC ...... *G11C 11/5628* (2013.01); *G11C 11/5642* (2013.01); *G11C 16/0483* (2013.01)

(58) Field of Classification Search
CPC ...... G06F 3/061; G06F 3/0655; G06F 3/0688; G11C 11/5628; G11C 11/5642; G11C 16/08
See application file for complete search history.

(56) References Cited

U.S. PATENT DOCUMENTS

| 7,167,109 B2 | 1/2007 | Hu et al. |
| 7,593,263 B2 | 9/2009 | Sokolov et al. |
| 7,668,012 B2 | 2/2010 | Aritome |
| 7,911,835 B2 | 3/2011 | Kim et al. |

(Continued)

OTHER PUBLICATIONS

Kurkoski, B., "Rewriting Codes for Flash Memories Based Upon Lattices, and an Example Using the E8 Lattice", IEEE Globecom 2010 Workshop on Application of Communication Theory to Emerging Memory Technologies; pp. 1923-1927; http://www.jaist.ac.jp/~kurkoski/papers/conf/Kurkoski-globecom10.pdf.

(Continued)

*Primary Examiner* — Uyen B Tran
(74) *Attorney, Agent, or Firm* — Loza & Loza, LLP; Gabriel Fitch

(57) ABSTRACT

Aspects of the disclosure provide a method and a data storage apparatus for storing fractional bits per cell with low-latency read per page. In various embodiments, the memory cells are configured to store a fractional number of bits per cell using a multi-page construction with reduced number of read per page as compared to a single page construction. The data storage apparatus store data in a plurality of non-volatile memory (NVM) cells configured to store information in a plurality of pages, wherein each of the NVM cells is programmable to one of L program states for representing a fractional number of bits. The data storage apparatus reads a first part of the data from a first page of the plurality of pages by applying M number of read voltages to the plurality of NVM cells, wherein the M number of read voltages is less than L−1 program states.

22 Claims, 14 Drawing Sheets

(56) References Cited

U.S. PATENT DOCUMENTS

| | | | |
|---|---|---|---|
| 8,332,578 B2 | 12/2012 | Frickey, III et al. | |
| 8,964,465 B2 | 2/2015 | Radke | |
| 9,280,456 B2 | 3/2016 | Varanasi | |
| 2009/0109745 A1* | 4/2009 | Aritome | G11C 11/5628 365/185.03 |
| 2012/0054416 A1* | 3/2012 | Kobayashi | G11C 11/5628 711/103 |
| 2013/0272071 A1* | 10/2013 | Moschiano | G11C 16/10 365/185.24 |
| 2014/0208054 A1* | 7/2014 | Parthasarathy | G06F 12/02 711/165 |
| 2015/0269992 A1* | 9/2015 | Hara | G11C 11/5628 365/185.03 |

OTHER PUBLICATIONS

Wu et al, "Reducing SSD Read Latency via NAND Flash Program and Erase Suspension", 7 pages; https://www.usenix.org/legacy/events/fast12/tech/full_papers/Wu.pdf.

Kaynak et al, "Bit interleaved coded modulation to enable fractional bits-per-cell storage at NAND flash memory" abstract, AEU—Intl Journal of Electronics and Communications, vol. 70, Issue 5, May 2016, pp. 707-717; ISSN 1434-8411; http://www.sciencedirect.com/science/article/pii/S1434841116300656.

\* cited by examiner

METHOD AND APPARATUS FOR LOW-LATENCY READ OF FLASH STORAGE DEVICES USING FRACTIONAL BITS PER CELL

FIELD

Aspects of the disclosure relate generally to solid state storage devices, and more specifically, to solid state storage devices utilizing Not-AND (NAND) flash memory cells.

BACKGROUND

In a variety of consumer electronics and computers, solid state drives or storage devices incorporating non-volatile memories (NVMs) are frequently replacing or supplementing conventional rotating hard disk drives for mass storage. These non-volatile memories may include one or more flash memory devices that may be logically divided into blocks, and each of the blocks may be further logically divided into addressable pages.

Solid state storage devices may use NAND flash memory cells for its high density and low cost per cell relative to other generally available non-volatile memory technology. Each NAND memory cell can be programmed to a certain program state or level. A single level cell (SLC) may be programmed to two states, for example, states 0 and 1. Some NAND flash memory cells may be programmed to more than two levels. This type of flash memory cell is generally referred to as multi level cell (MLC). Increasing the number of programmable states or levels allows a cell to store more bits per cell. For example, a cell can store 2 bits using four levels, 3 bits using eight levels, and 4 bits using sixteen levels.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Aspects of the disclosure provide a method and a data storage apparatus for storing fractional bits per cell with low-latency read per page. In various embodiments, the memory cells are configured to store a fractional number of bits per cell using a multi-page construction with reduced number of read per page as compared to single page construction.

In one aspect of the disclosure, this disclosure relates to a method of operating a solid state drive (SSD). The SSD stores data in a plurality of non-volatile memory (NVM) cells configured to store information in a plurality of pages, wherein each of the NVM cells is programmable to one of L program states for representing a fractional number of bits. The SSD reads a first part of the data from a first page of the plurality of pages by applying M number of read voltages to the plurality of NVM cells, wherein the M number of read voltages is less than L−1 program states. The SSD may further read a second part of the data from a second page of the plurality of pages by applying N number of read voltages to the plurality of NVM cells, wherein the N number of read voltages is less than L−1 program states, and the M number of read voltages and the N number of read voltages are different. The SSD may further read a third part of the data from a third page of the plurality of pages by applying O number of read voltages to the plurality of NVM cells, wherein the O number of read voltages is less than the L−1 program states, and at least two of the M number of read voltages, the N number of read voltages, and the O number of read voltages are different.

In another aspect of the disclosure, this disclosure relates to a solid state data storage device that includes a controller and a plurality of non-volatile memory (NVM) cells operatively coupled to the controller. The controller is configured to store data in the plurality of NVM cells configured to store information in a plurality of pages, wherein each of the NVM cells is programmable to one of L program states for representing a fractional number of bits. The controller is further configured to read a first part of the data from a first page of the plurality of pages by applying M number of read voltages to the plurality of NVM cells, wherein the M number of read voltages is less than L−1 program states.

In another aspect of the disclosure, this disclosure relates to a solid state data storage device that includes means for storing data in a plurality of non-volatile memory (NVM) cells configured to store information in a plurality of pages, wherein each of the NVM cells is programmable to one of L program states for representing a fractional number of bits. The solid state data storage device further includes means for reading a first part of the data from a first page of the plurality of pages by applying M number of read voltages to the plurality of NVM cells, wherein the M number of read voltages is less than L−1 program states.

DETAILED DESCRIPTION

Figure 1:
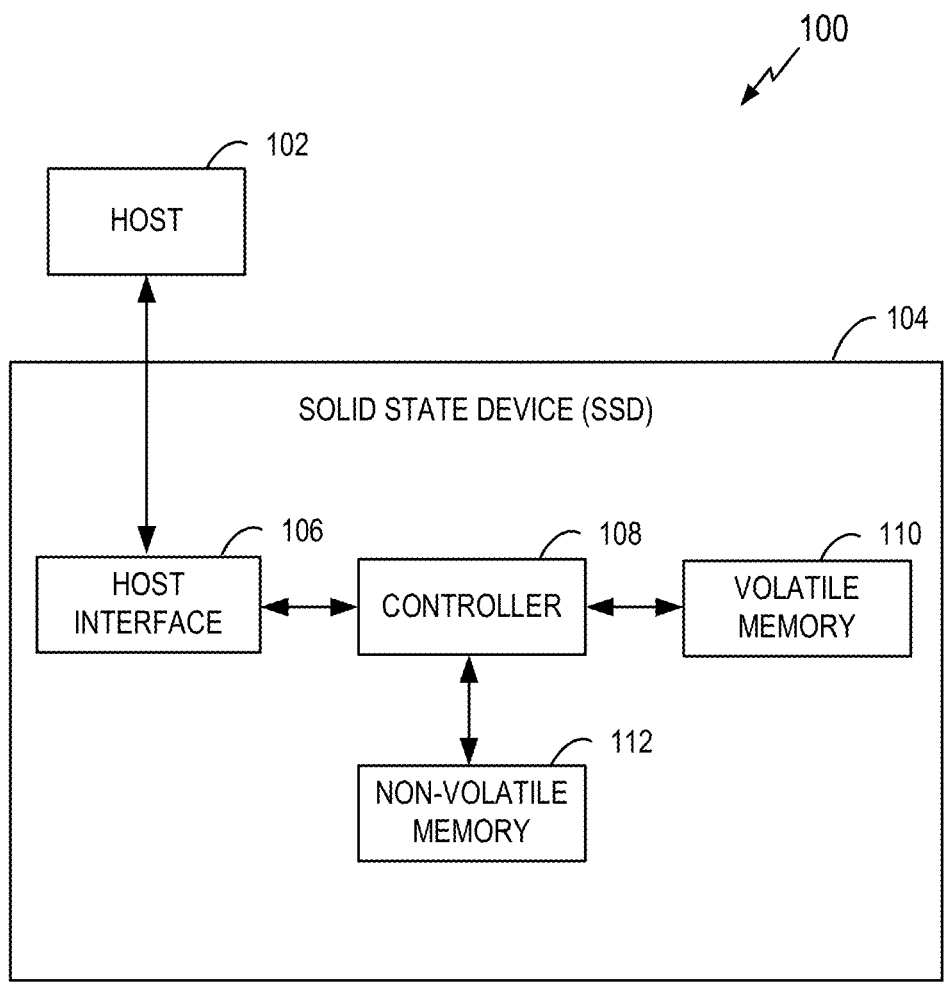
FIG. 1 is a diagram of a solid state device (SSD) that enables low-latency read of NAND flash memory in accordance with one embodiment of the disclosure.

Referring now to the drawings, systems and methods for storing fractional bits per cell with low-latency read per page are illustrated. In the illustrated embodiments, negative-AND (NAND) flash memory cells are used to illustrate the methods for reducing the number of reads per page used to read data from the memory cells. In various embodiments, the memory cells are configured to store a fractional number of bits per cell using a multi-page construction.

FIG. 1 is a block diagram of a solid state device (SSD) that can perform various functions to enable low-latency read of non-volatile memory in accordance with some embodiments of the disclosure. The system 100 includes a host 102 and an SSD 104 coupled to the host 102. The host 102 provides various commands to the SSD 104 for transferring data between the host 102 and the SSD 104. For example, the host 102 may provide a write command to the SSD 104 for writing data to the SSD 104 or read command to the SSD 104 for reading data from the SSD 104. The host 102 may be any system or device having a need for data storage or retrieval and a compatible interface for communicating with the SSD 104. For example, the host 102 may a computing device, a personal computer, a portable computer, or workstation, a server, a personal digital assistant, a digital camera, a digital phone, or the like.

The SSD 104 includes a host interface 106, a controller 108, a volatile memory 110, and a non-volatile memory (NVM) 112. One example of NVM is NAND flash memory or the like. The host interface 106 is coupled to the controller 108 and facilitates communication between the host 102 and the controller 108. Additionally, the controller 108 is coupled to the volatile memory 110 and the NVM 112. The host interface 106 may be any type of communication interface, such as an Integrated Drive Electronics (IDE) interface, a Universal Serial Bus (USB) interface, a Serial Peripheral (SP) interface, an Advanced Technology Attachment (ATA) interface, a Small Computer System Interface (SCSI), an IEEE 1394 (Firewire) interface, a Peripheral Component Interconnect Express (PCIe) interface, a Non-Volatile Memory Express (NVMe) interface, or the like. In some embodiments, the host 102 includes the SSD 104. In other embodiments, the SSD 104 is remote with respect to the host 102 or is contained in a remote computing system coupled in communication with the host 102. For example, the host 102 may communicate with the SSD 104 through a wired and/or wireless communication link. In some examples, the SSD 104 may be included in a network based storage system.

The controller 108 controls the operation of the SSD 104. In various embodiments, the controller 108 receives commands from the host 102 through the host interface 106 and performs the commands to transfer data between the host 102 and the NVM 112. The controller 108 may include any type of processing device, such as a microprocessor, a microcontroller, an embedded controller, a logic circuit, software, firmware, or the like, for controlling operation of the SSD 104. In one embodiment, the controller 108 can be a special purpose controller specifically configured/programmed to perform any of the functions contained within the application.

In some embodiments, some or all of the functions described herein as being performed by the controller 108 may instead be performed by another element of the SSD 104. The functions of the host interface 106 and the controller 108 may be implemented in the same device. For example, the SSD 104 may include a microprocessor, a microcontroller, an embedded controller, a logic circuit, a field-programmable gate array (FPGA), an application-specific integrated circuit (ASIC), software, firmware, or any kind of processing device, for performing one or more of the functions described herein as being performed by the controller 108 and/or host interface 106. In some embodiments, one or more of the functions described herein as being performed by the controller 108 and/or host interface 106 are instead performed by the host 102. In some embodiments, some or all of the functions described herein as being performed by the controller 108 may instead be performed by another element such as a controller in a hybrid drive including both non-volatile memory elements and magnetic storage elements.

The volatile memory 110 may be any memory, computing device, or system capable of storing data. The volatile memory 110 can maintain its data while the device is powered. For example, the volatile memory 110 may be a random-access memory (RAM) such as a dynamic random-access memory (DRAM), a static random-access memory (SRAM), a synchronous dynamic random-access memory (SDRAM), or the like. In various embodiments, the controller 108 uses the memory 110, or a portion thereof, to store data during the transfer of data between the host 102 and the NVM 112. For example, the volatile memory 110 or a portion of the memory 110 may be a cache memory that may be used to store recently accessed data to improve access speed. In some embodiments, the SSD 104 may not include the volatile memory 110.

The controller 108 can control writing data to and reading data from the NVM 112. The NVM 112 may include one or more types of non-volatile data storages, such as a flash storage system, a solid state drive, a flash memory card, a secure digital (SD) card, a universal serial bus (USB) memory device, a CompactFlash card, a SmartMedia device, a flash storage array, a flash storage, an erasable programmable read-only-memory (EPROM), an electrically erasable programmable read-only-memory (EEPROM), magnetoresistive random-access memory, non-volatile RAM, ferroelectric RAM, or phase-change RAM, or the like.

Figure 2:
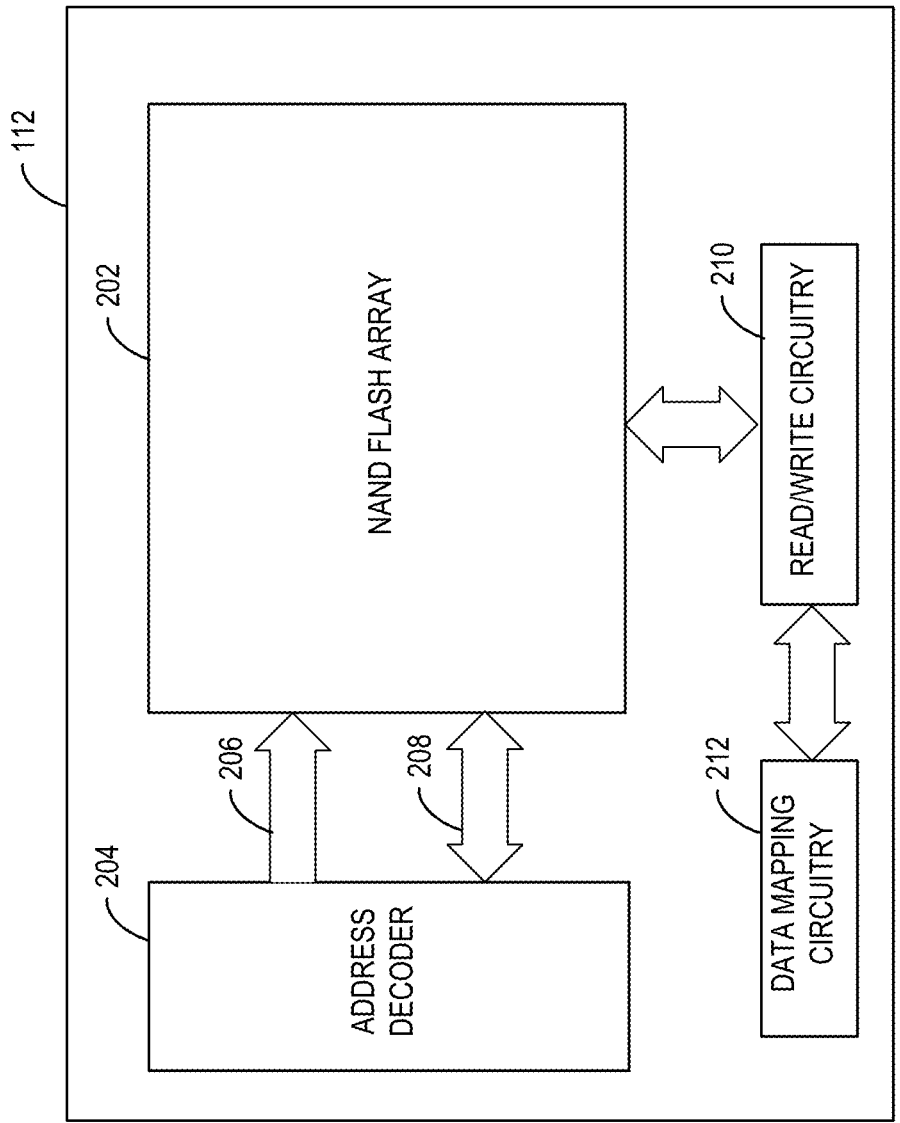
FIG. 2 is a conceptual block diagram of a non-volatile memory (NVM) in accordance with one embodiment of the disclosure.

FIG. 2 is a conceptual block diagram of the NVM 112 in accordance with some embodiments of the disclosure. In this example, the NVM 112 includes a NAND flash memory array 202 that includes a plurality of memory cells or devices. The NVM 112 may include an address decoder 204 for addressing the NAND flash memory array 202 by selecting one or more wordlines and bit lines 206 connected to the desired cells. Therefore, data 208 may be written or read to/from the memory array 202. The NVM 112 may include a read/write circuitry 210 that is configured to generate various voltages and/or currents for writing, reading, and/or erasing the memory cells of the array 202. The read/write circuitry 210 may also be configured to sense or detect the voltage and/or current of each cell of the memory array 202 to read data from the cells. Each of the memory cells may be programmed to a certain program state among a number of program states or levels. For example, a multi level cell (MLC) may be programmed to one of 4, 8, or 16 levels (program states). A MLC can store an integer number B of bits when it is capable of being programmed to one of $2^B$ discrete program states or levels. In some embodiments, each cell of the array 202 may store a fractional number F of bits. For example, two cells may each be programmed to one of six levels, and the two cells combined can be programmed to one of 36 program states. Therefore, two cells together can store 5 bits of data (i.e., 32 states) with each cell storing 2.5 bits (i.e., fractional bit per cell). In another example, two cells may each be programmed to one of 12 levels, and the two cells together can store 7 bits of data with each cell storing 3.5 bits. The present disclosure is not limited to the above examples of fractional bit storage schemes, and different combinations of cells and fractional bits per cell may be used in other embodiments.

The NVM 112 may include a data mapping circuitry 212 that is operatively coupled with the read/write circuitry 210 and/or address decoder 204. The data mapping circuitry 212 may be configured to perform various functions to map or configure some or all of the memory of the NAND flash array 202 to have multiple pages (e.g., logical or virtual pages) for storing data. For example, the data mapping circuitry 212 may receive data from the host 102 or controller 108 to be stored in the NVM 112, and determine to store the data in one or more predetermined pages. In some examples, the data may include parts or portions of the data that correspond to (e.g., contain all or portions of) different files or data structures, and the data mapping circuitry 212 (e.g., working together with read/write circuitry 210) may store the different parts in different pages, respectively. The data mapping circuitry 212 may maintain information on the pages that store the different parts of data. When the host reads data (e.g., a file) from the NVM 112, the controller 108 and/or the data mapping circuitry 212 can determine the page that stores the requested data, and the read/write circuitry 210 can generate the correct read voltage(s) to read the data from that page. In some embodiments, the data mapping circuitry 212 or its functions may be included in the controller 108.

Figure 3:
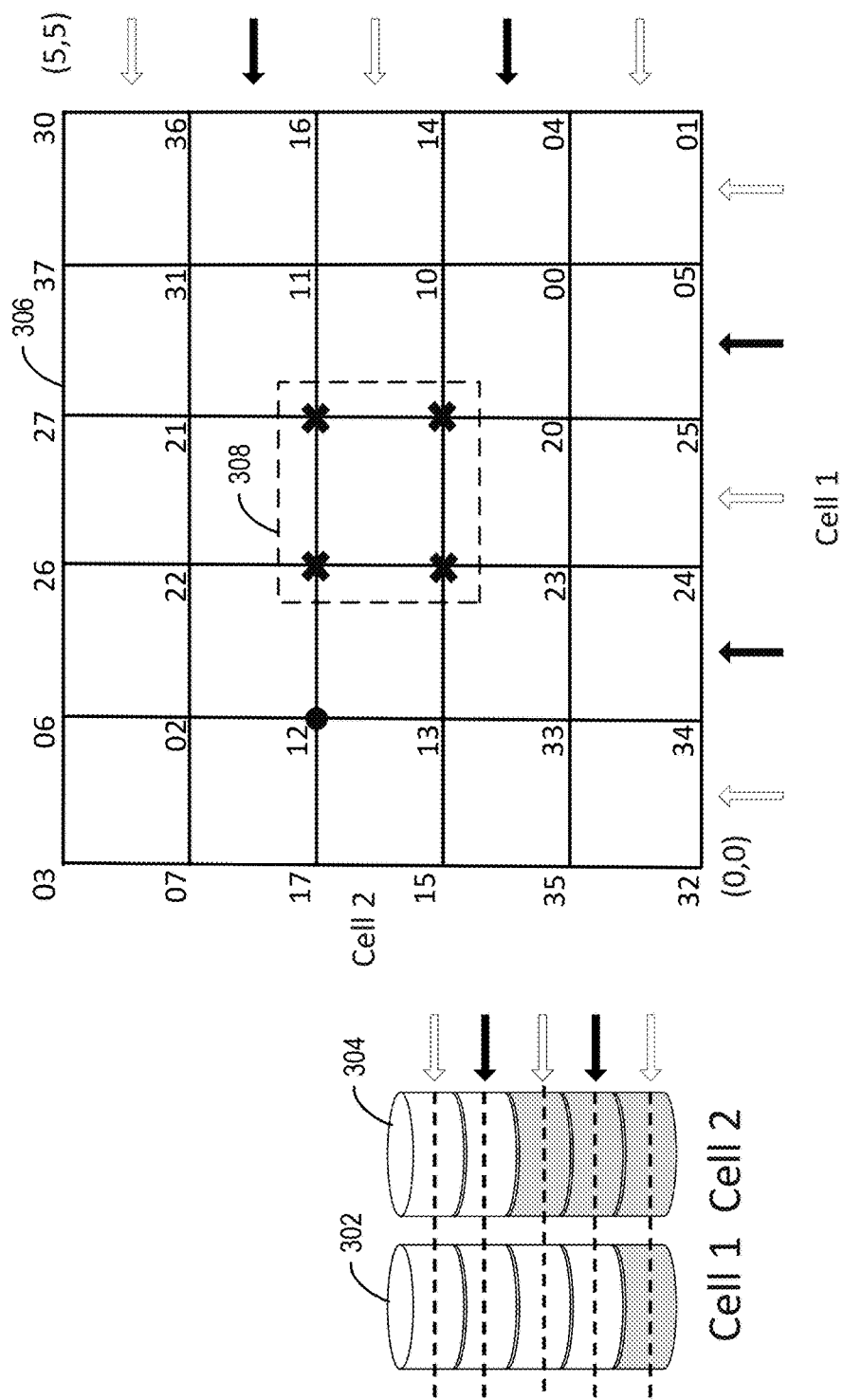
FIGS. 3-5 are conceptual diagrams illustrating an example of storing 2.5 fractional bits per cell using a two-page construction in accordance with one embodiment of the disclosure.
Figure 4:
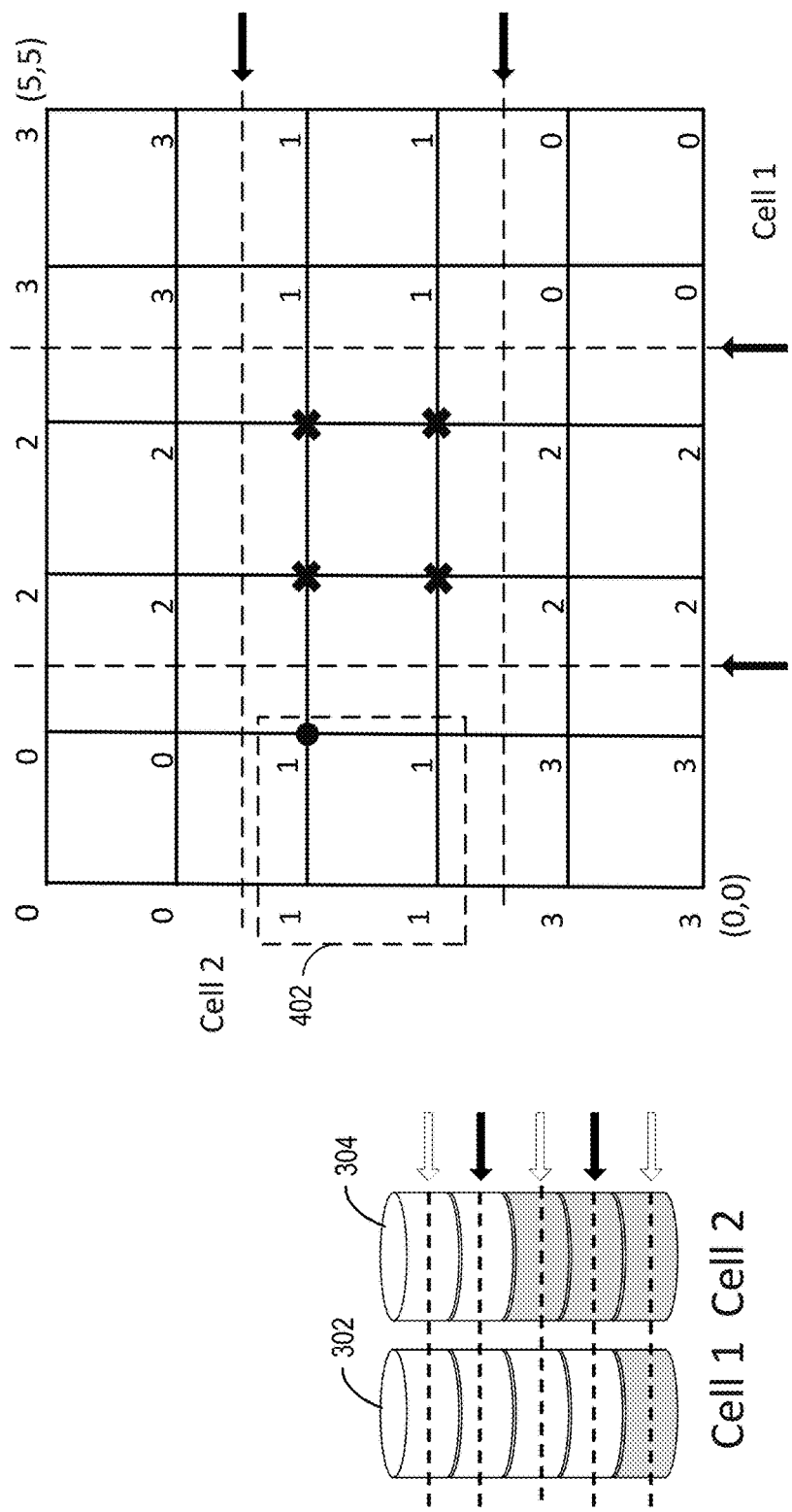
Figure 5:
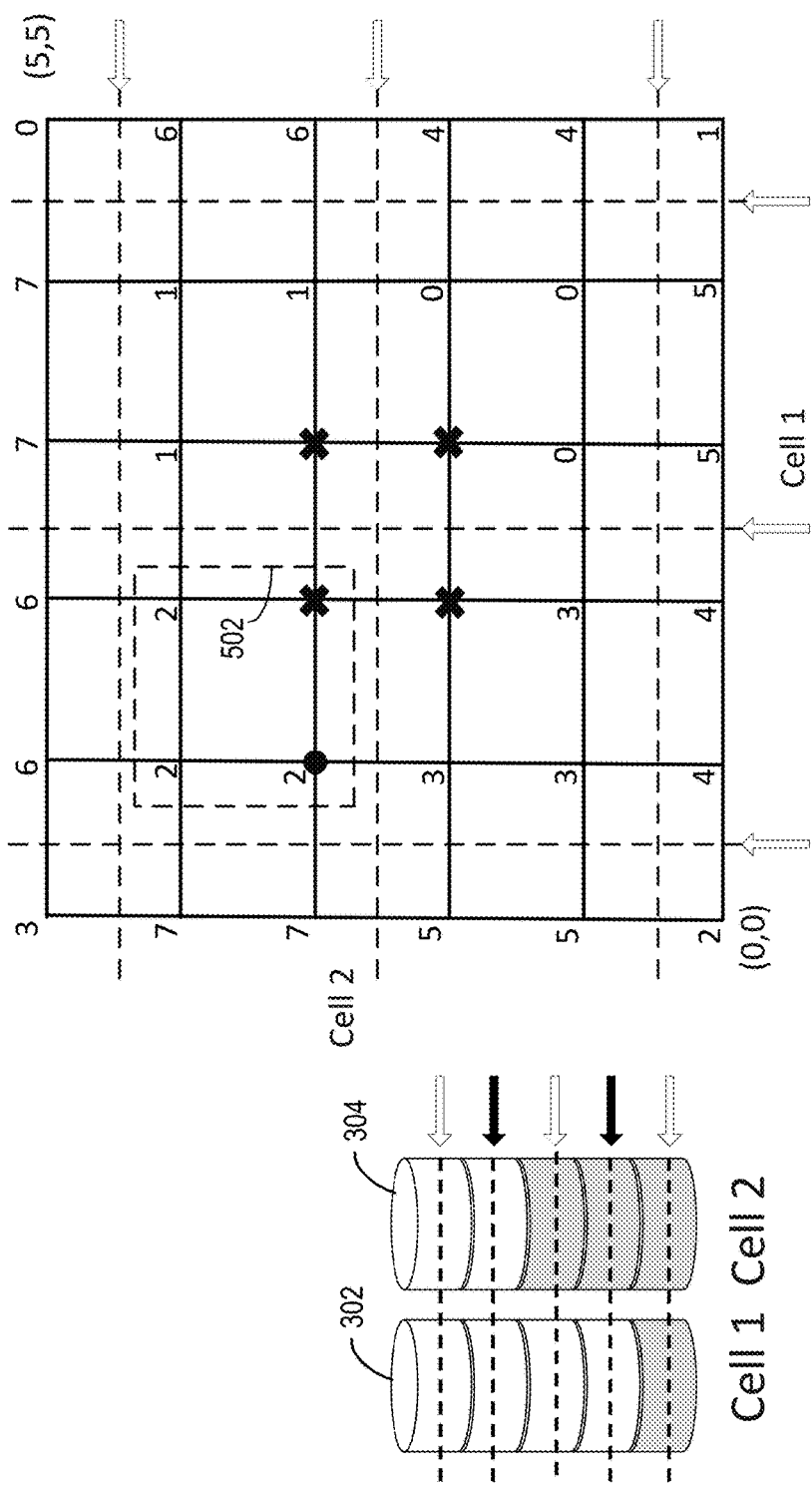

FIGS. 3-5 are conceptual diagrams illustrating an example of storing 2.5 fractional bits per cell using a two-page construction according to one embodiment. In this example, two cells of the NAND flash memory array 202 together may be used to store 5 bits of data. That is, each cell can store 2.5 bits of data in this example. Each cell can be programmed to one of six program states (e.g., level 0 through level 5). To read data from the NAND flash memory cells, a read voltage may be applied to the cells (e.g., through a wordline) and a voltage and/or current is sensed on bit lines connected to the cells. In the related art, a cell is read L−1 times (L being the number of program states or levels that can be stored at a cell) to determine the program state of that cell. Therefore, for a cell that has six program states, the cell needs to be read five times to determine the cell's program state. As the number of program states per cell increases, the number of reads also increases. Therefore, MLC has higher read latency as the number of program states increases. Similarly, a triple level cell (TLC) has eight program states and needs 7 reads to determine its program state. A quad level cell (QLC) has sixteen program states and needs 15 reads to determine its program state. In this disclosure, MLC may be used to refer to any NVM cell (e.g., TLC and QLC) that has more than two program states.

Embodiments of the present disclosure provide various methods to reduce the number of reads needed to read data from NVM cells configured to store fractional bits per cell. In FIG. 3, two MLC cells (e.g., NAND cells) together can be configured to provide thirty-two program states (states 0 to 31) using a two-page construction for storing 2.5 bits per cell. In other words, two cells 302, 304 (cell 1 and cell 2) can store five bits of data (e.g., $b_4$ $b_3$ $b_2$ $b_1$ $b_0$). Thirty-two available program states are illustrated in a two-dimensional grid 306 in FIG. 3. Four states 308 are not used or invalid. The invalid states may be located in other positions and have different configurations in other embodiments. In this example, the first cell 302 (cell 1) is programmed to level 1, and the second cell 304 (cell 2) is programmed to level 3. The five data bits may be mapped to different pages (e.g., virtual pages) respectively. In this example, two bits (e.g., $b_4$ $b_3$) may be assigned to a first page (page 1), and three bits (e.g., $b_2$ $b_1$ $b_0$) may be assigned to a second page (page 2). Therefore, the first page can store a value between 0 and 3, and the second page can store a value between 0 to 7. Together, the two pages can store five bits of data using two cells. In other embodiments, the SSD 104 may map the data bits differently. For example, more or less bits may be mapped to the first page, and more or less bits may be mapped to the second page.

In FIG. 3, the available data values for both pages are identified using two digits (one digit for each page). The first digit (left digit) represents the bits of the first page, and the second digit (right digit) represents the bits of the second page. For example, in FIG. 3, at the location with the value 12, the first page can store a value of 1 (i.e., $01_2$), and the second page can store a value of 2 (i.e., $010_2$). To determine the program state or level of the cells, a certain read voltage (e.g., threshold voltage) is applied to the cells. The methods to read NAND cells are generally known in the art and will not be repeated herein for brevity.

In this embodiment, two read voltages 312 are used to read the value stored at the first page (page 1), and three read voltages 314 are used to read the value stored at the second page. Referring to FIG. 4, only the first page (page 1) and its corresponding programmable values (0 to 3) are shown. After applying two read voltages 312, the SSD controller 108 can determine that the value stored at the first page is located in one of nine regions 402. Each of these regions 402 is mapped to the same integer value between 0 to 3 corresponding to two bits of data. In this example, the SSD controller 108 can determine that the value of the first page is stored in the region containing the value of 1 after performing two reads. In other examples, the regions may have other configurations as long as each region contains the same value between 0 and 3, and the SSD can determine the region corresponding to the program state of the cell using two read operations.

Referring to FIG. 5, only the second page (page 2) and its corresponding programmable values (0 to 7) are shown. After applying three read voltages 314, the SSD controller 108 can determine that the value stored at the second page (page 2) is located in one of sixteen regions 502. Each of these regions 502 is mapped to the same integer value between 0 to 7 corresponding to eight bits of data. Some regions may have only a single value (data value), and other regions have multiple same values. In this example, the SSD controller 108 determines that the value stored at the second page has the value of 2. In other embodiments, the regions 502 may have other configurations as long as each region is mapped to the same value(s) between 0 to 7, inclusive.

In this embodiment, the SSD 104 can read the data values from both pages of the memory array using a total of five reads, achieving an average of 2.5 reads per page. This is better than the 1-page construction for 2.5 bits/cell that needs five reads per page to read data from the cells. With the 2-page constructions with fractional bits per cell described above in relation to FIGS. 3-5, the SSD may store different files using different pages, respectively. Therefore, when the SSD reads a certain file from the memory array, the SSD only needs to read the corresponding page using fewer reads per page than the 1-page construction. While only two cells are illustrated in FIGS. 3-5, the memory array may be configured to have more than 2 cells per page in certain designs.

Figure 6:
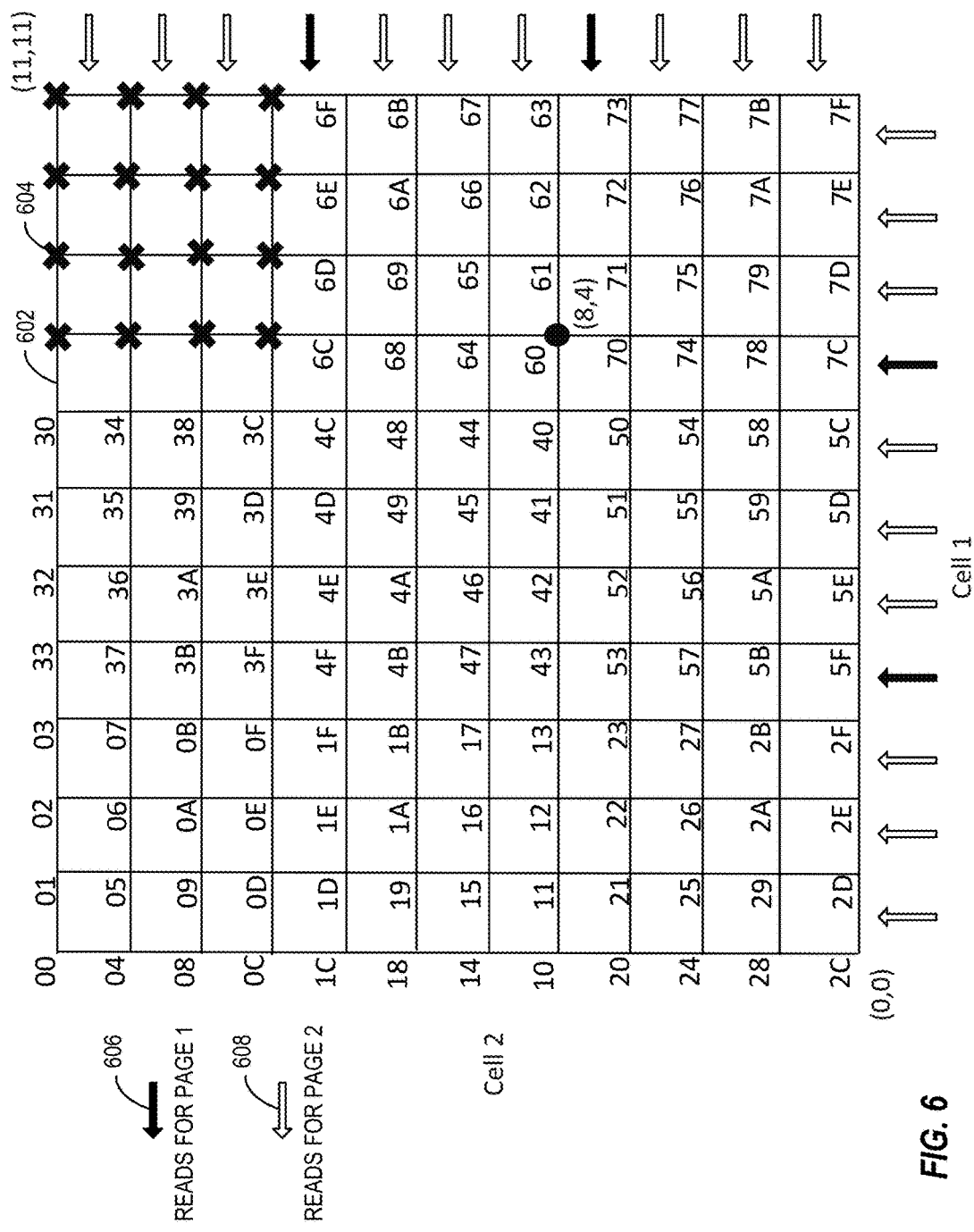
FIGS. 6-8 are conceptual diagrams illustrating an example of storing 3.5 fractional bits per cell using a two-page construction in accordance with one embodiment of the disclosure.
Figure 7:
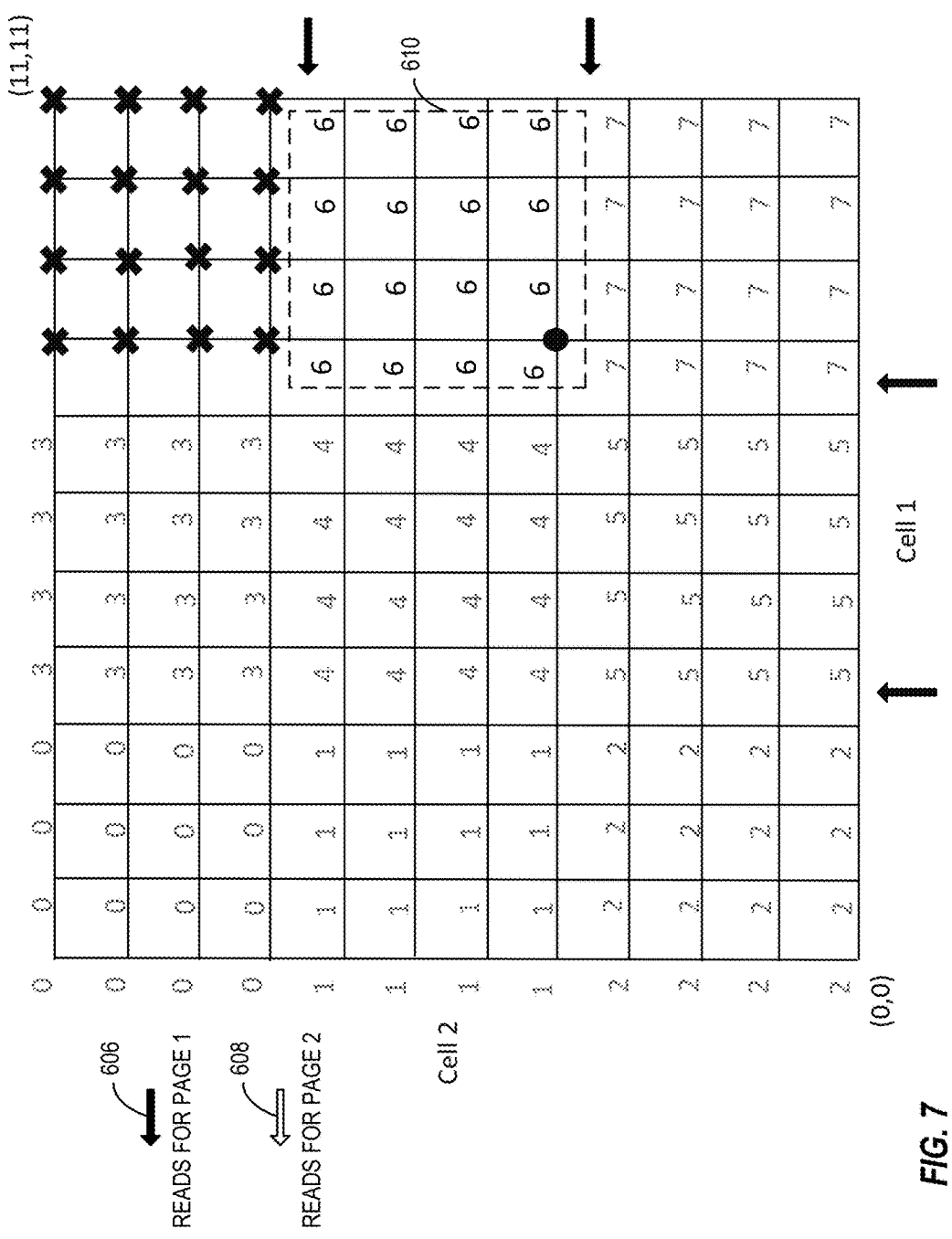
Figure 8:
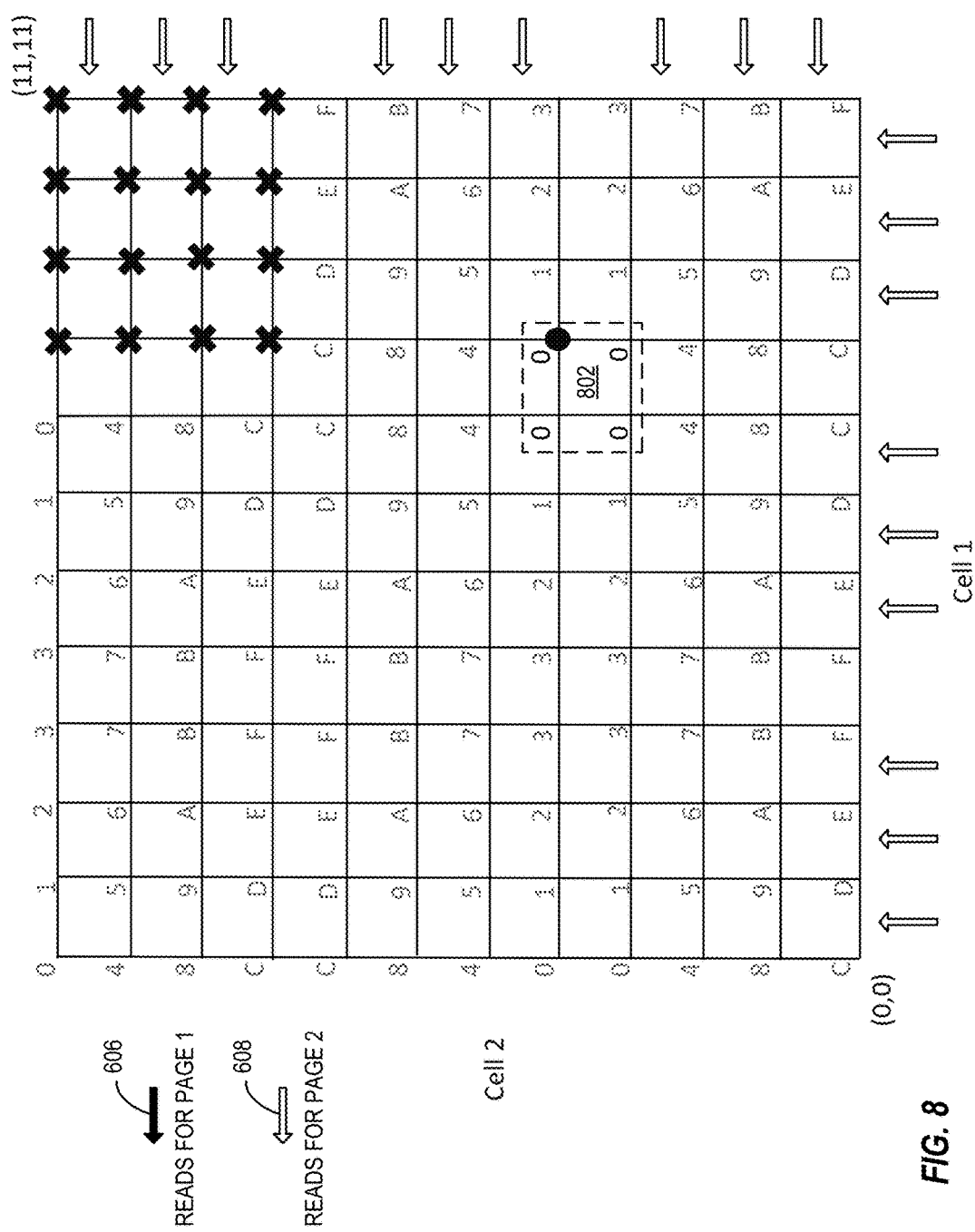

FIGS. 6-8 are conceptual diagrams illustrating an example of storing 3.5 fractional bits per cell using a two-page construction according to one embodiment of the disclosure. In this example, two cells of the memory array 202 may be used to store 7 bits of data. That is, each cell can store 3.5 bits of data in this example. Each cell can be programmed to one of twelve program states (e.g., voltage level 0 through level 11). In other examples, the cells may be programmed to more or fewer numbers of program states.

In the related art, to read data from memory cells with twelve program states, the cell needs to be read eleven times to determine the cell's program state. Embodiments of the present disclosure provide a method to reduce the number of reads used to read a page of a memory array configured to store 3.5 fractional bits per cell. In FIG. 6, two cells (e.g., NAND cells) together can be configured to provide 128 program states (states 0 to 127) using a two-page construction for storing 3.5 bits per cell. In other words, two cells (cell 1 and cell 2) can store seven bits of data (e.g., $b_6$ $b_5$ $b_4$ $b_3$ $b_2$ $b_1$ $b_0$). FIG. 6 illustrate the 128 available program states in a two-dimensional grid 602. Sixteen states are not used or invalid (denoted by cross symbols 604) in this example. The invalid states may be located in other positions and have different configurations in other embodiments. In this example, the first cell (cell 1) may be programmed to level 8, and the second cell (cell 2) may be programmed to level 4. The seven data bits may be mapped to different pages in this embodiment. In this example, three bits (e.g., $b_6$ $b_5$ $b_4$) may be assigned to the first page, and four bits (e.g., $b_3$ $b_2$ $b_1$ $b_0$) may be assigned to the second page. Therefore, the first page can store a value between 0 and 7, and the second page can store a value between 0 and 15. In other embodiments, the SSD 104 may map the data bits to the pages differently.

In FIG. 6, the available data values for both pages are identified using two digits (one digit for each page). The first digit (left digit) represents the bits of the first page, and the second digit (right digit) represents the bits of the second page. For example, in FIG. 6, the value 60 means that the first page stores a value of 6 (i.e., $110_2$) at this program state, and the second page stores a value of 0 (i.e., $0000_2$) at this program state.

In this embodiment, two read voltages 606 are used to read the value stored at the first page (page 1), and nine voltages 608 are used to read the value stored at the second page (page 2). Referring to FIG. 7, only the first page (page 1) and its corresponding programmable values (0 to 7) are shown. After applying two read voltages 606, the SSD 104 or its controller 108 can determine that the value stored at the first page is located in one of nine regions 610. Each of these regions 610 is mapped to the same data value between 0 to 7. In this example, the SSD controller 108 can determine that the value of the first page is stored in the region having the value of 6 after performing two reads. In other examples, the regions may have other configuration as long as each region contains the same value, and the SSD can determine the region corresponding to the program state of the cells using two read operations.

Referring to FIG. 8, only the second page (page 2) and its corresponding programmable values (0 to F) are shown. After applying nine read voltages 608, the SSD 104 or its controller 108 can determine that the value stored at the second page is located in one of one hundred regions 802. Each of these regions 802 is mapped to the same data value between 0 to F (hexadecimal values). Some regions may be mapped a single value, and other regions may be mapped to multiple same values. In this example, the SSD controller 108 determines that the value stored at the second page has the value of 0. In other embodiments, the regions 802 may have other configurations as long as each region is mapped to the same value(s) between 0 to F, inclusive.

In this embodiment, the SSD 104 can read the data values from both pages of the memory array using a total of 11 reads, achieving an average of 5.5 reads per page. It is an improvement from the 1-page construction for 3.5 bits/cell that needs eleven reads per page to read the data from the cells. With the 2-page construction described above in relation to FIGS. 6-8, the SSD 104 may store different files in different pages, respectively. For example, a first file may be stored using the first page, and a second file may be stored using the second page. Therefore, when the SSD needs to read a certain file from the memory array, the SSD only needs to read the corresponding page. While only two cells are illustrated in FIGS. 6-8, the memory array may be configured to have more than 2 cells per page in other embodiments.

FIGS. 9-12 are conceptual diagrams illustrating an example of storing 3.5 fractional bits per cell using a three-page construction according to one embodiment. In this example, two cells of the memory array 202 may be used to store 7 bits of data. That is, each cell can store 3.5 bits of data in this example. Each cell can be programmed to one of twelve program states (e.g., voltage level 0 through level 11).

Figure 9:
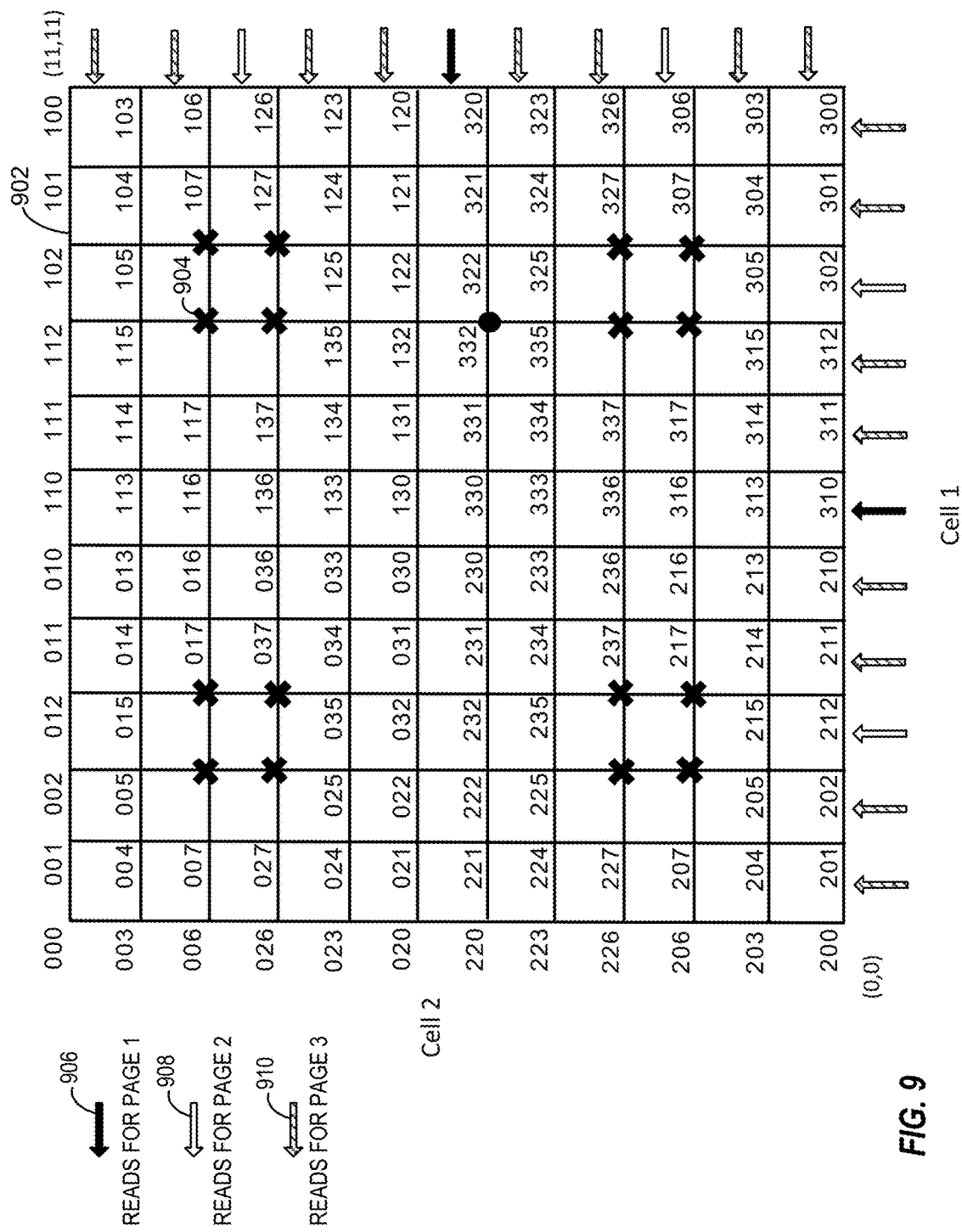
FIGS. 9-12 are conceptual diagrams illustrating an example of storing 3.5 fractional bits per cell using a three-page construction in accordance with one embodiment of the disclosure.

In FIG. 9, two cells (e.g., NAND cells) together can be configured to provide 128 program states (states 0 to 127) using a three-page construction for storing 3.5 bits per cell. In other words, two cells (cell 1 and cell 2) can store seven bits of data (e.g., $b_6$ $b_5$ $b_4$ $b_3 b_2 b_1$ $b_0$). FIG. 9 illustrates the 128 available program states in a two-dimensional grid 902. Sixteen states are not used or invalid (denoted by cross symbols 904) in this example. The invalid states may be located in other positions and have different configurations in other embodiments. In this example, the first cell (cell 1) may be programmed to level 8, and the second cell (cell 2) may be programmed to level 5. The seven data bits may be mapped to different pages in this embodiment. In this example, two bits (e.g., $b_6$ $b_5$) may be assigned to a first page, two bits (e.g., $b_4$ $b_3$) may be assigned to a second page, and three bits (e.g., $b_2$ $b_1$ $b_0$) may be assigned to a third page. Therefore, the first page can store a data value between 0 and 3, the second page can store a data value between 0 and 3, and the third page can store a data value between 0 and 7. In other embodiments, the SSD 104 may map the data bits to the pages differently.

In FIG. 9, the available data values for all three pages are identified using three digits (one digit for each page). The first digit (left most digit) represents the bits of the first page, the middle digit represents the bits of the second page, and the third digit (right most digit) represents the bits of the third page. For example, in FIG. 9, the value 332 means that the first page stores a data value of 3 (i.e., $11_2$), the second page stores a data value of 3 (i.e., $11_2$), and the third page stores a data value of 2 (i.e., $010_2$).

Figure 10:
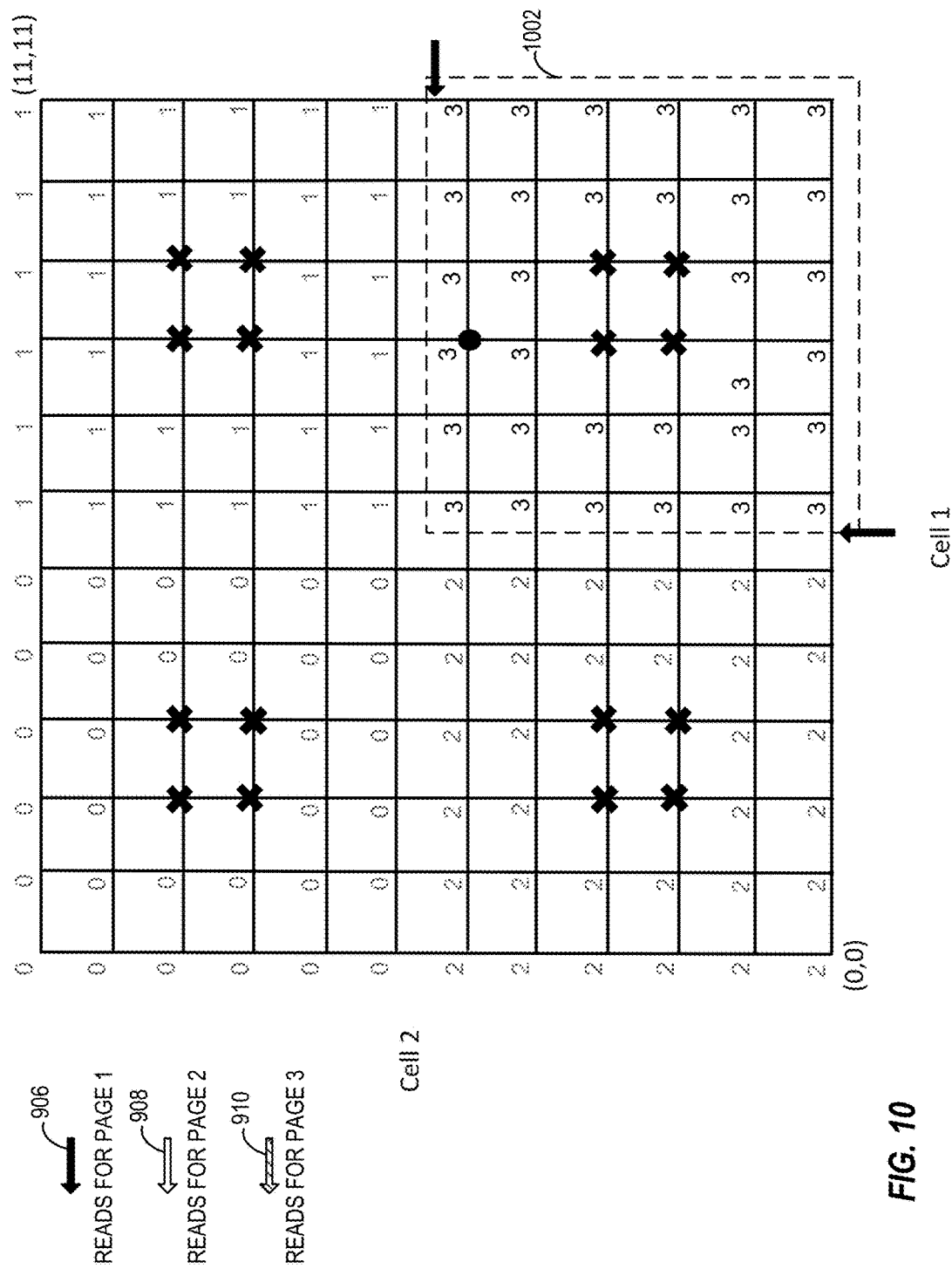

In this embodiment, one read voltage 906 may be used to read the value stored at the first page (page 1), two read voltages 908 may be used to read the value stored at the second page (page 2), and eight read voltages 910 may be used to read the value stored at the third page (page 3). Referring to FIG. 10, only the first page (page 1) and its corresponding programmable values (0 to 4) are shown. After applying one read voltage 906, the SSD 104 or its controller 108 can determine that the value stored at the first page is located in one of four regions 1002. Each of these regions 1002 is mapped to the same data value between 0 to 3. In this example, the SSD controller 108 can determine that the value of the first page is stored in the region mapped to the value of 3 after performing one read. In other examples, the regions may have other configurations as long as each region contains the same data value, and the SSD can determine the region corresponding to the program state of the cells using one read operation.

Figure 11:
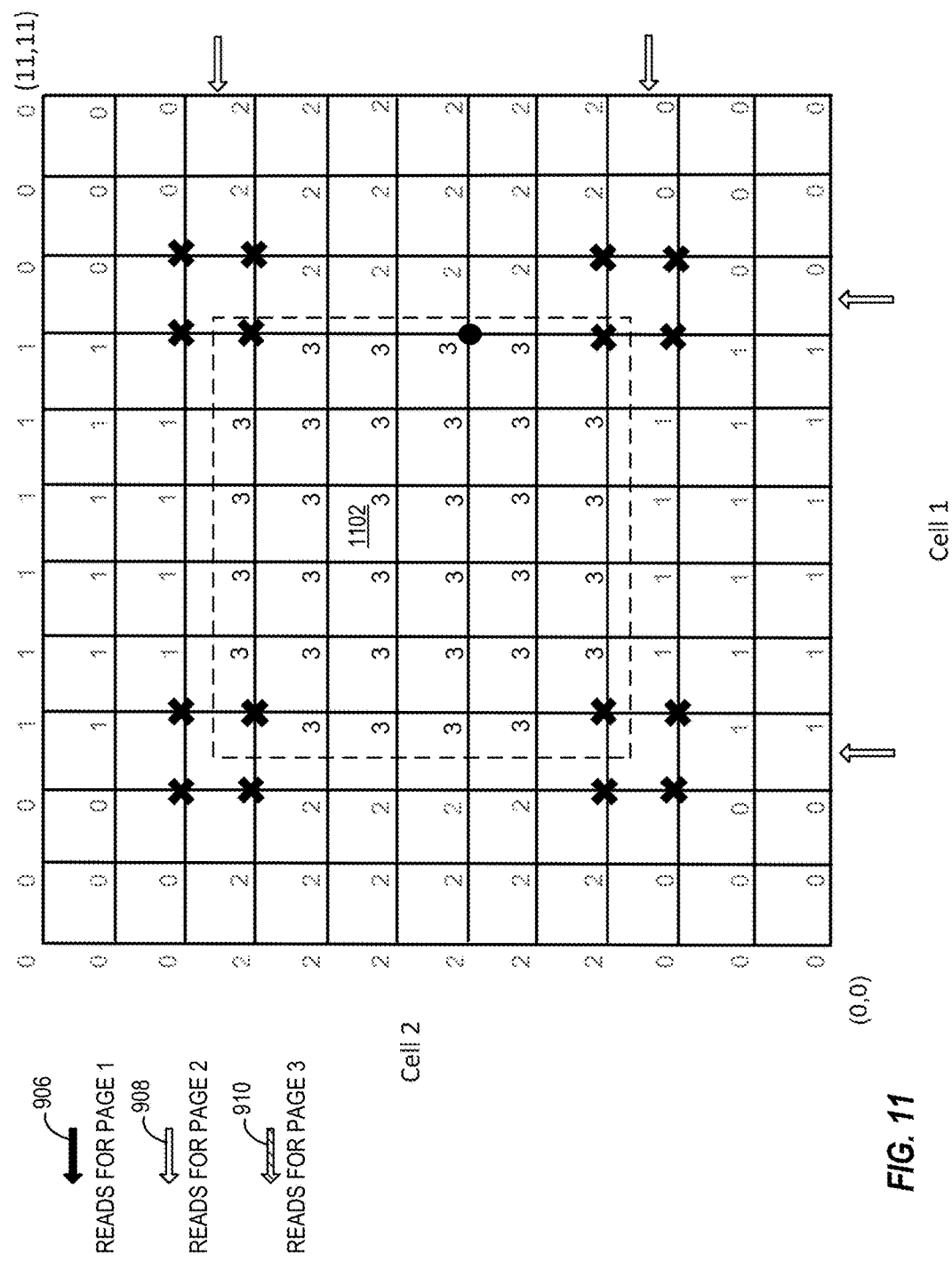

Referring to FIG. 11, only the second page (page 2) and its corresponding programmable values (0 to 3) are shown. After applying two read voltages 908, the SSD 104 or its controller 108 can determine that the value stored at the second page is located in one of nine regions 1102. Each of these regions 1102 is mapped to the same data value between 0 to 3. Some regions may have more values than other regions. Some regions may be mapped to the same values. In this example, the SSD controller 108 determines that the value stored at the second page has the value of 3. In other embodiments, the regions 1102 may have other configurations as long as each region is mapped to the same value(s) between 0 to 3, inclusive.

Figure 12:
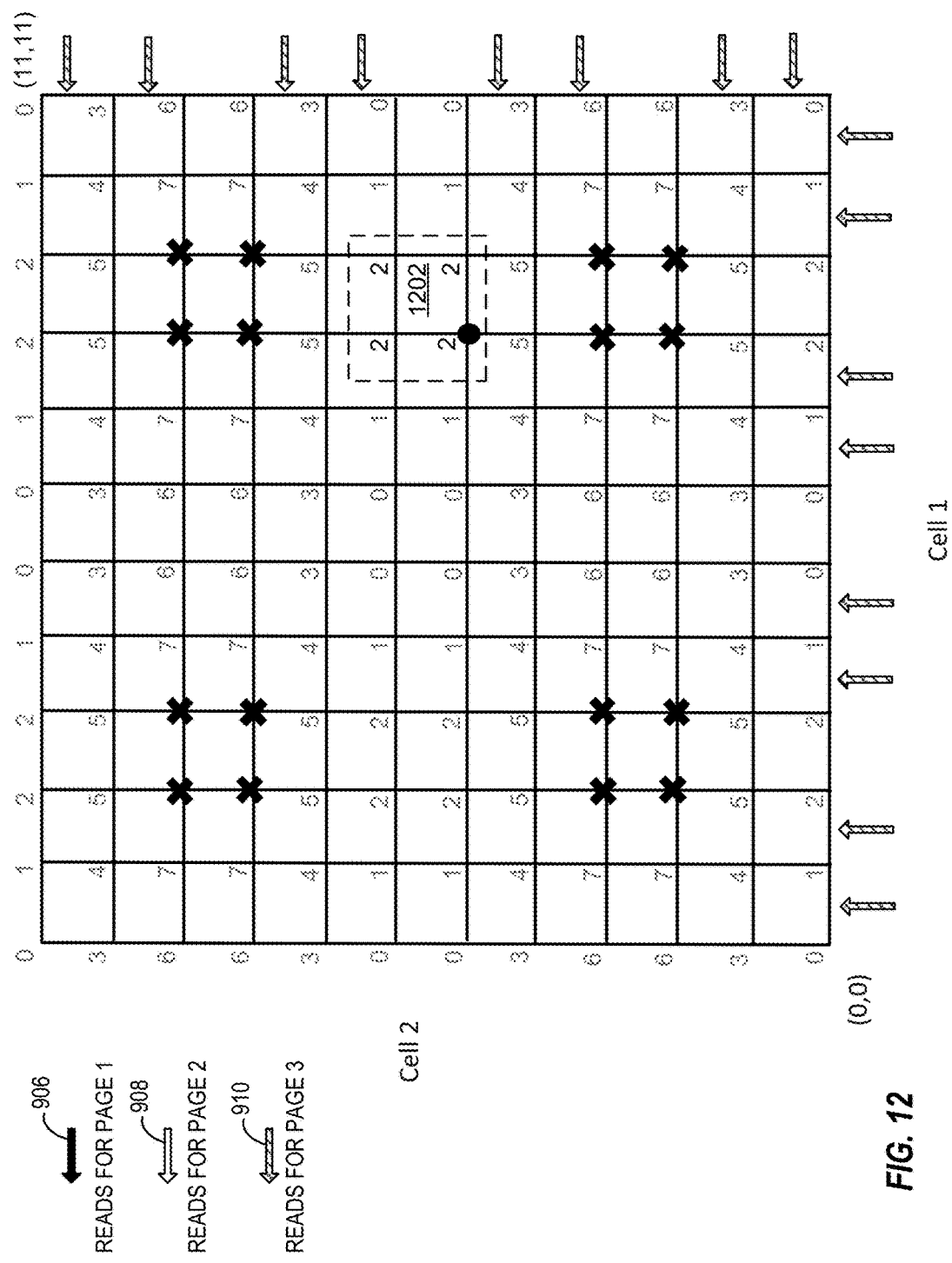

Referring to FIG. 12, only the third page (page 3) and its corresponding programmable values (0 to 7) are shown. After applying eight read voltages 910, the SSD 104 or its controller 108 can determine that the value stored at the third page is located in one of eighty-one regions 1202. Each of these regions 1202 is mapped to the same data value between 0 to 3. Some regions may have more values than other regions. Some regions may be mapped to the same values. In this example, the SSD controller 108 determines that the value stored at the third page has the value of 2. In other embodiments, the regions 1202 may have other configurations as long as each region is mapped to the same value(s) between 0 to 7, inclusive.

In this embodiment, the SSD can read the data values from all three pages of the memory array using a total of 11 reads, achieving an average of 3.67 reads per page. It is an improvement from the 1-page construction for 3.5 bits/cell that needs eleven reads per page to read the data from the cells. With the 3-page construction described above in relation to FIGS. 9-12, the SSD may store different files in different pages, respectively. For example, a first file may be stored using the first page, a second file may be stored using the second page, and a third file may be stored using the second page. Therefore, when the SSD needs to read a certain file from the memory array, the SSD only needs to read the corresponding page. While only two cells are illustrated in FIGS. 9-12, the memory array may be configured to have more than 2 cells per page and/or more than 3 pages in certain designs.

Figure 13:
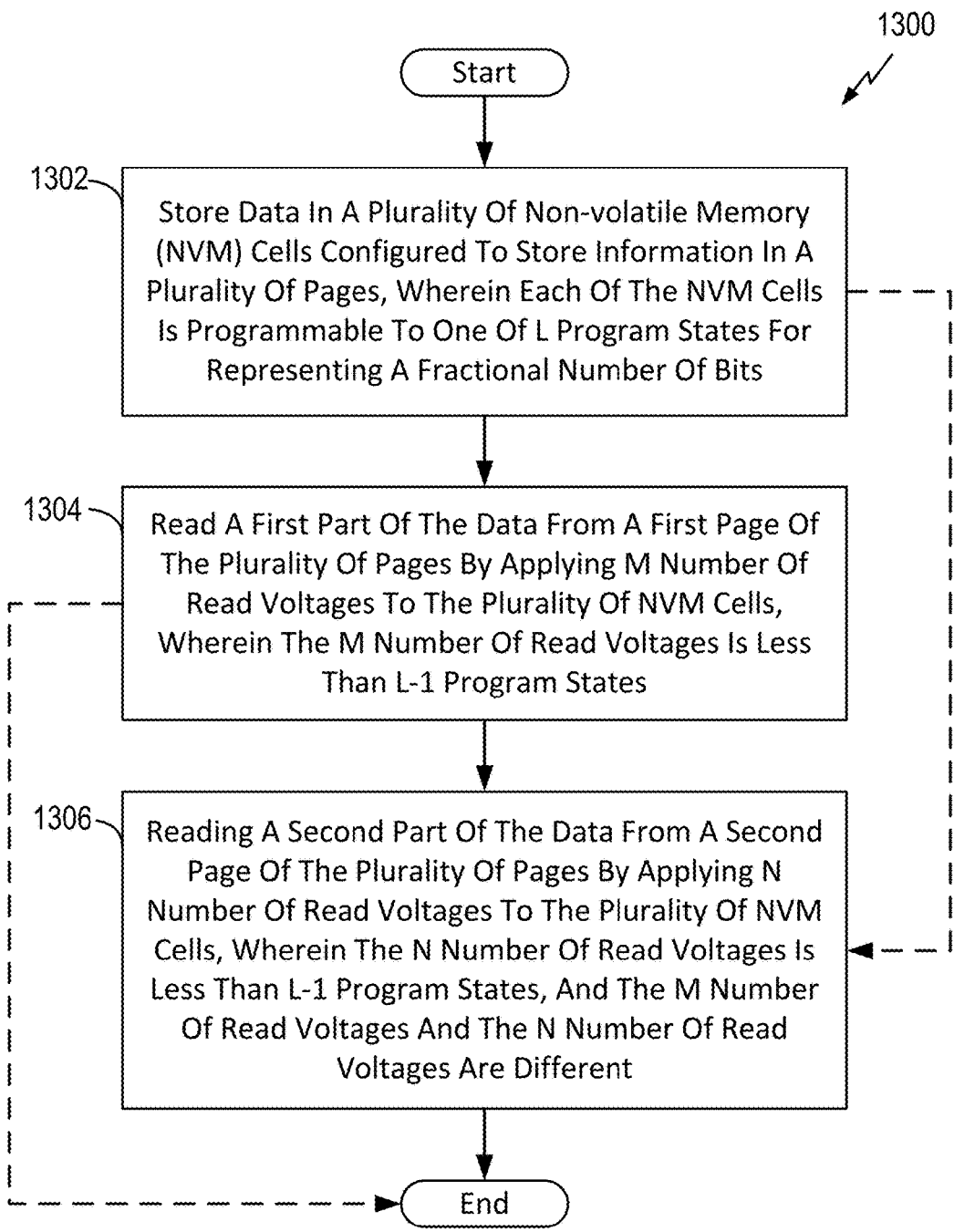
FIG. 13 is a flow chart of a process for reading data stored in a plurality of NVM cells in accordance with one embodiment of the disclosure.

FIG. 13 is a flow chart of a process 1300 for reading data stored in a plurality of non-volatile memory (NVM) cells configured to store fractional bits per cell in accordance with one embodiment of the disclosure. In some examples, the process 1300 may be used to read data from the NVM cells with multi-page constructions as described in relation to FIGS. 3-12 above. At block 1302, the SSD 104 or its controller 108 may store data in a plurality of NVM cells configured to store information in a plurality of pages. Each of the NVM cells is programmable to one of L program states for representing a fractional number of bits. For example, the NVM cells may include two NAND memory cells each programmable to 6 levels for storing 2.5 bits per cell (e.g., see FIG. 3-5) or 12 levels for storing 3.5 bits per cell (e.g., see FIG. 6-12). In one embodiment, the block 1302 may represent one means for storing data in a plurality of NVM cells configured to store information in a plurality of pages, wherein each of the NVM cells is programmable to one of L program states for representing a fractional number of bits.

Figure 14:
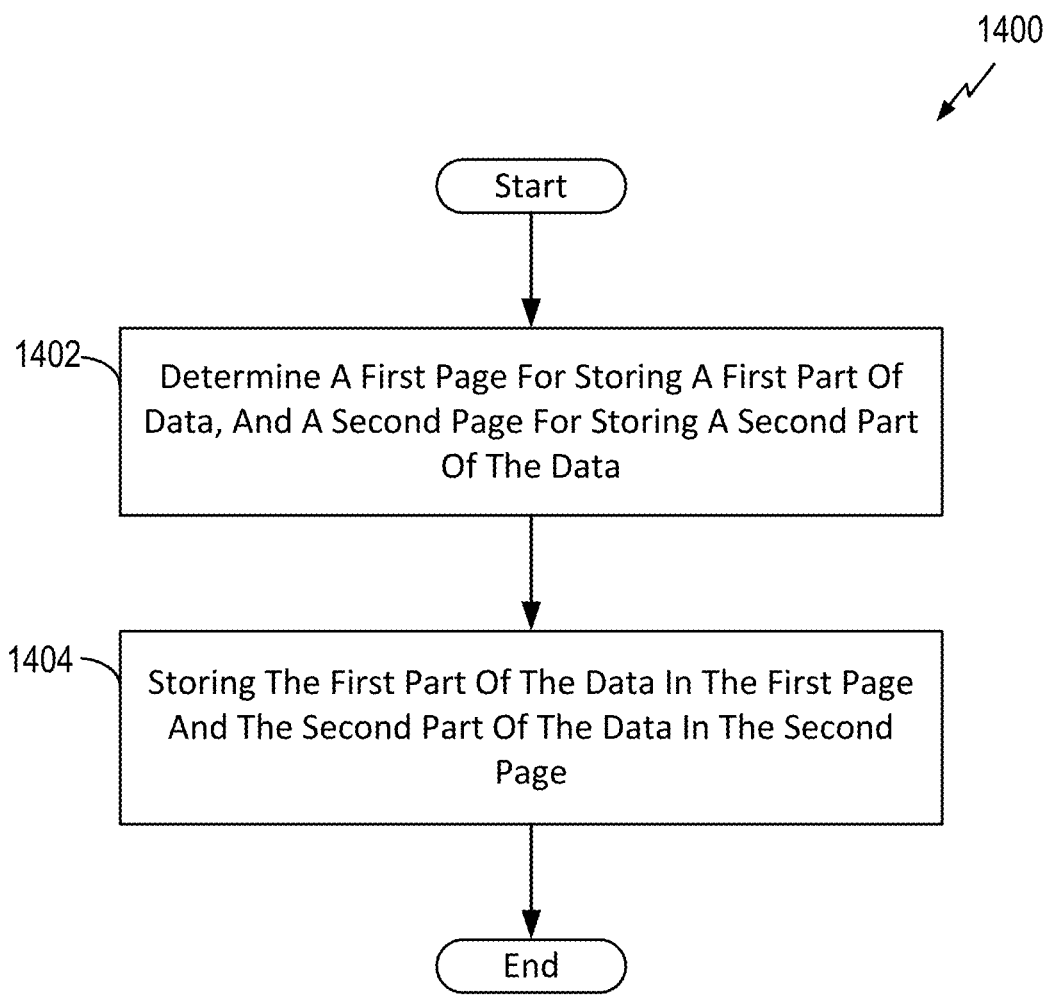
FIG. 14 is a flow chart illustrating a process for storing data in multiple pages of the NVM cells in accordance with one embodiment of the disclosure.

FIG. 14 is a flow chart illustrating a process 1400 for storing data in multiple pages of the NVM cells in accordance with one embodiment of the disclosure. In some examples, the process 1400 may be used to store data into the NVM cells with multi-page constructions as described in relation to FIGS. 3-12 above. When the SSD 104 stores certain data into the NVM 112, the mapping circuitry 212 may determine a first page for storing a first part of data and a second page for storing a second part of the data, at block 1402. Then, at block 1404, the SSD may store the first part of the data in the first page and second part of the data in the second page. In some examples, the first part of the data corresponds to (e.g., contains all or a portion of) a first file, and the second part of the data corresponds to (e.g., contains all or a portion of) a second file that is different from the first file. In some examples, the mapping circuitry 212 may determine and store data in multiple pages (e.g., 2 or more pages) concurrently. In other examples, more than two parts of the data may be stored in more than two pages, respectively. In still other examples, a single file may be stored in one or more pages.

Referring back to FIG. 13, at block 1304, the SSD 104 or its controller 108 may read a first part of the data from a first page of the plurality of pages by applying M number of read voltages to the plurality of NVM cells, wherein the M number of read voltages is less than the L−1 number of program states. For example, the first page may be any of the pages illustrated in FIG. 4, 7, or 10. In one embodiment, the block 1304 may represent one means for reading a first part of the data from a first page of the plurality of pages by applying M number of read voltages to the plurality of NVM cells, wherein the M number of read voltages is less than L−1 program states.

At block 1306, the SSD 104 or its controller 108 may read a second part of the data from a second page of the plurality of pages by applying N number of read voltages to the plurality of NVM cells, wherein the N number of read voltages is less than the L−1 number of program states, and the M number of read voltages and the N number of read voltages may be the same or different. In one embodiment, the block 1306 may represent the means for reading a second part of the data from a second page of the plurality of pages by applying N number of read voltages to the plurality of NVM cells.

For example, the second page may be any of the pages illustrated in FIG. 5, 8, or 11. In some embodiments, the SSD may read the data from the first page and second page in other orders or combinations. In one example, the SSD may read data only from one page (e.g., the first page or second page). In another example, the SSD may read data from the second page and then data from the first page. In general, the SSD can read the pages (e.g., two or more pages) independently and separately. That is, the SSD can read data from the second page without any prior knowledge on the first page, and vice versa. Using the above described processes illustrated in FIGS. 13 and 14, the SSD can read data from the NVM cells using fewer number of reads per page as compared to the related art configured to store fractional bits per cell.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other suitable manner Tasks or events may be added to or removed from the disclosed example embodiments. The example systems and components described herein may be configured differently than described. For example, elements may be added to, removed from, or rearranged compared to the disclosed example embodiments.

What is claimed is:

1. A method of operating a solid state drive, the method comprising:

storing data in a plurality of non-volatile memory (NVM) cells configured to store information in a plurality of pages, wherein each of the NVM cells is programmable to one of L program states for representing a fractional number of bits; and reading a first part of the data from a first page of the plurality of pages by applying M number of read voltages to the plurality of NVM cells, wherein the M number of read voltages is less than L−1 program states.

2. The method of claim 1, further comprising:

reading a second part of the data from a second page of the plurality of pages by applying N number of read voltages to the plurality of NVM cells, wherein the N number of read voltages is less than L−1 program states, and the M number of read voltages and the N number of read voltages are different in number.

3. The method of claim 2, wherein the first part of the data corresponds to a first file, and the second part of the data corresponds to a second file that is distinct from the first file.

4. The method of claim 2, further comprising:

reading a third part of the data from a third page of the plurality of pages by applying O number of read voltages to the plurality of NVM cells, wherein the O number of read voltages is less than the L−1 program states, and at least two of the M number of read voltages, the N number of read voltages, and the O number of read voltages are different in number.

5. The method of claim 1, further comprising:

reading different parts of the data from the respective pages of the plurality of pages by applying an average of N number of read voltages to the plurality of NVM cells, wherein the N number of read voltages is less than the L−1 program states.

6. The method of claim 1, wherein the storing comprises:

storing the first part of the data in the first page; and
storing a second part of the data in a second page of the plurality of pages, wherein the first page is configured to store a greater quantity of different values than the second page.

7. The method of claim 1, further comprising:

reading a second part of the data from a second page of the plurality of pages by applying N number of read voltages to the plurality of NVM cells, wherein the N number of read voltages is less than the L−1 number of program states, and wherein the read voltages of the first page are different from the read voltages of the second page.

8. The method of claim 1, wherein the plurality of NVM cells comprise NAND flash memory cells.

9. The method of claim 1, wherein the storing comprises storing the first part of the data in a region of the first page mapped to a plurality of first values.

10. A solid state data storage device comprising:

a controller; and a plurality of non-volatile memory (NVM) cells operatively coupled to the controller, wherein the controller is configured to:

store data in the plurality of NVM cells configured to store information in a plurality of pages, wherein each of the NVM cells is programmable to one of L program states for representing a fractional number of bits; and read a first part of the data from a first page of the plurality of pages by applying M number of read voltages to the plurality of NVM cells, wherein the M number of read voltages is less than L−1 program states.

11. The solid state data storage device of claim 10, wherein the controller is configured to:

read a second part of the data from a second page of the plurality of pages by applying N number of read voltages to the plurality of NVM cells, wherein the N number of read voltages is less than L−1 program states, and the M number of read voltages and the N number of read voltages are different in number.

12. The solid state data storage device of claim 11, wherein the controller is further configured to:

store the first part of the data to the first page of the NVM cells; and store the second part of the data to the second page of the NVM cells, wherein the first page is configured to store a greater quantity of different values than the second page.

13. The solid state data storage device of claim 12, wherein the controller is further configured to:

set a first cell of the NVM cells to a first program level and a second cell of the NVM cells to a second program level, to store at least one of the first part of the data and the second part of the data.

14. A solid state data storage device comprising:

means for storing data in a plurality of non-volatile memory (NVM) cells configured to store information in a plurality of pages, wherein each of the NVM cells is programmable to one of L program states for representing a fractional number of bits; and means for reading a first part of the data from a first page of the plurality of pages by applying M number of read voltages to the plurality of NVM cells, wherein the M number of read voltages is less than L−1 program states.

15. The solid state data storage device of claim 14, further comprising:

means for reading a second part of the data from a second page of the plurality of pages by applying N number of read voltages to the plurality of NVM cells, wherein the N number of read voltages is less than L−1 program states, and the M number of read voltages and the N number of read voltages are different in number.

16. The solid state data storage device of claim 15, wherein the first part of the data corresponds to a first file, and the second part of the data corresponds to a second file that is distinct from the first file.

17. The solid state data storage device of claim 15, further comprising:
   means for reading a third part of the data from a third page of the plurality of pages by applying O number of read voltages to the plurality of NVM cells,
   wherein the O number of read voltages is less than the L−1 program states, and at least two of the M number of read voltages, the N number of read voltages, and the O number of read voltages are different in number.

18. The solid state data storage device of claim 14, further comprising:
   means for reading different parts of the data from the respective pages of the plurality of pages by applying an average of N number of read voltages to the plurality of NVM cells, wherein the N number of read voltages is less than the L−1 program states.

19. The solid state data storage device of claim 14, wherein the storing comprises:
   means for storing the first part of the data in the first page; and
   means for storing a second part of the data in a second page of the plurality of pages, wherein the first page is configured to store a greater quantity of different values than the second page.

20. The solid state data storage device of claim 14, further comprising:
   means for reading a second part of the data from a second page of the plurality of pages by applying N number of read voltages to the plurality of NVM cells,
   wherein the N number of read voltages is less than the L−1 number of program states, and
   wherein the read voltages of the first page are different from the read voltages of the second page.

21. The solid state data storage device of claim 14, wherein the plurality of NVM cells comprise NAND flash memory cells.

22. The solid state data storage device of claim 14, wherein the storing comprises storing the first part of the data in a region of the first page mapped to a plurality of first values.

* * * * *